United States Patent [19]

Inomata et al.

[11] Patent Number: 5,773,156
[45] Date of Patent: Jun. 30, 1998

[54] MAGNETORESISTANCE EFFECT ELEMENT

[75] Inventors: Koichiro Inomata; Keiichiro Yusu, both of Yokohama; Roger Highmore, Tokyo; Shiho Okuno, Fujisawa; Yoshiaki Saito, Kawasaki, all of Japan

[73] Assignee: Kabushiki Kaisha Toshiba, Kawasaki, Japan

[21] Appl. No.: 591,350

[22] Filed: Jan. 25, 1996

[30] Foreign Application Priority Data

Jan. 26, 1995 [JP] Japan .................................. 7-010654

[51] Int. Cl.⁶ .......................... H01F 10/12; H01F 1/00
[52] U.S. Cl. ...................... 428/611; 428/546; 428/620; 428/641; 360/113; 338/32 R
[58] Field of Search ................... 428/611, 546, 428/620, 641, 928; 360/113; 338/32 R

[56] References Cited

U.S. PATENT DOCUMENTS

| | | | |
|---|---|---|---|
| 5,043,693 | 8/1991 | Edelstein | 338/32 R |
| 5,304,975 | 4/1994 | Saito et al. | 338/32 R |
| 5,452,163 | 9/1995 | Coffey et al. | 360/113 |
| 5,463,516 | 10/1995 | Valet et al. | 360/113 |
| 5,476,680 | 12/1995 | Coffey et al. | 427/130 |
| 5,585,196 | 12/1996 | Inomata et al. | 428/557 |
| 5,594,933 | 1/1997 | Hayashi et al. | 428/546 |

OTHER PUBLICATIONS

A.E. Berkowitz, et al. "Giant Magnetoresistance in Heterogeneous Cu–Co Alloys", *Physical Review Letters*, vol. 68, No. 25, Jun. 22, 1992, pp. 3745–3748.

*Primary Examiner*—Daniel Zirker
*Attorney, Agent, or Firm*—Oblon, Spivak, McClelland, Maier & Neustadt, P.C.

[57] ABSTRACT

A magnetoresistance effect element comprises a magnetic body obtained by dispersing magnetic metal particles containing at least one magnetic element selected from the group consisting of Fe, Co, and Ni in a semiconductor matrix.

20 Claims, 3 Drawing Sheets

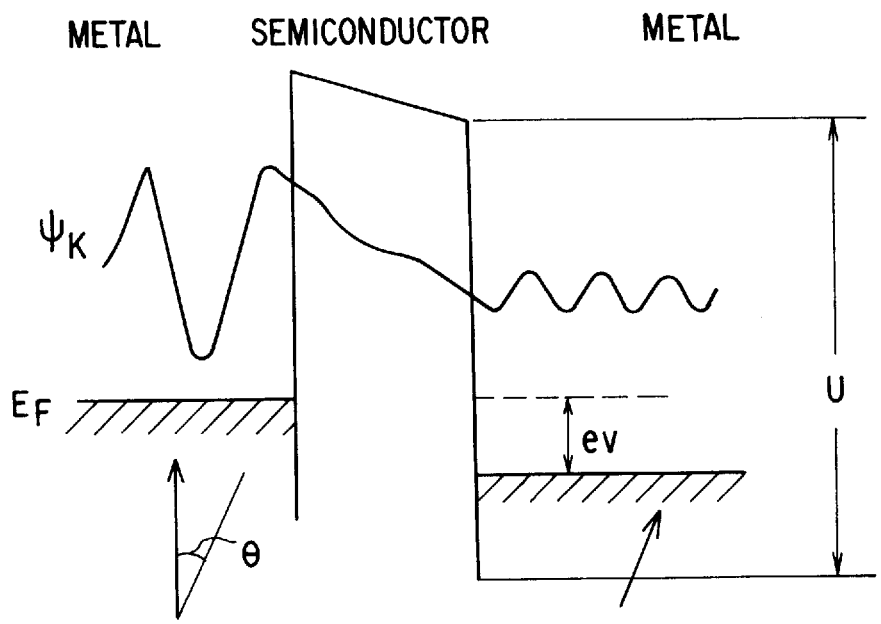
F I G. 1
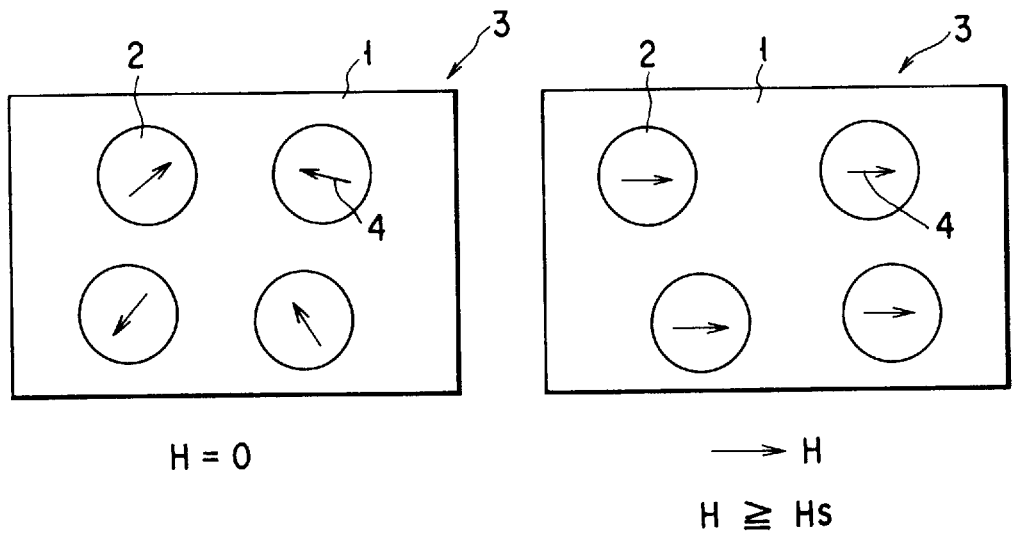
F I G. 2A  F I G. 2B

MAGNETORESISTANCE EFFECT ELEMENT

BACKGROUND OF THE INVENTION

1. Field of the Invention

The present invention relates to a magnetoresistance effect element using a magnetic material obtained by dispersing magnetic metal particles in a semiconductor matrix.

2. Description of the Related Art

A magnetoresistance effect is a phenomenon in which a certain type of magnetic material has an electric resistance changed by applying a magnetic field to the magnetic material. This phenomenon is used for a magnetic field sensor, a magnetic head, or the like. For example, a magnetoresistance effect element using a ferromagnetic material advantageously has excellent thermal stability and can be used in a large temperature range.

Conventionally, although a thin film of a permalloy or the like is used for a magnetoresistance effect element using a magnetic material, the permalloy thin film has a small magnetoresistance ratio of about 2% to 3%. For this reason, this magnetoresistance effect element cannot obtain a sufficient sensitivity.

In recent years, as a new material exhibiting a magnetoresistance effect, an artificial lattice film having the following multilayered structure attracts attention because of its giant-magnetoresistance effect. That is, magnetic layers and non-magnetic metal layers are alternately stacked on each other at a period of several-angstrom to several-ten-angstrom order, and magnetic layers opposing each other through a non-magnetic metal layer are magnetically coupled to each other in a state wherein the magnetic moments of the magnetic layers are anti-parallel to each other. For example, an artificial lattice film (Phys. Rev. Lett. 61, 2472 (1988)) of $(Fe/Cr)_n$, an artificial lattice film (J. Mag. Mag. Mat. 94, L1 (1991), Phys. Rev. Lett. 66, 2125 (1991)) of $(CO/Cu)_n$, and the like have been found out.

Such an artificial lattice film exhibits a magnetoresistance ratio of several ten % which is considerably higher than that of a conventional permalloy thin film. Such a giant-magnetoresistance effect is caused by scattering of electrons depending on the spin direction of the magnetic layer.

However, such an artificial lattice film has following problems. That is, the number of layers of the film must be large to obtain a large magnetoresistance effect, and the artificial lattice film cannot be directly applied to a magnetic head or the like because the film has a large saturation magnetic field (magnetic field in which a resistance is saturated), i.e., several teslas (T) or more.

In order to decrease a saturation magnetic field, a so-called spin valve film having a multilayered film having a sandwich structure constituted by ferromagnetic/non-magnetic/ferromagnetic layers is developed. In this spin valve film, an exchange bias is applied to one ferromagnetic layer to fix its magnetization, and an external magnetic field is applied to the other ferromagnetic layer to reverse its magnetization, thereby changing the relative angle between the magnetization directions of the two ferromagnetic layers.

However, the magnetoresistance ratio of the spin valve film is not relatively large, i.e., about 3% to 4%, and the resistance of the multilayered film itself is low, i.e., several 10 $\Omega$cm. For this reason, disadvantageously, a relatively large current must flow to detect the external magnetic field.

In addition, recently, it has be found that a so-called granular magnetic film in which, unlike the artificial lattice film described above, magnetic ultra-fine particles are dispersed in a non-magnetic metal matrix has a giant-magnetoresistance effect (for example, Phys. Rev. Lett. 68 3745 (1992)).

In such a granular magnetic film in the zero magnetic field, the spins of magnetic ultra-fine particles are spun in irregular directions due to the characteristics of the magnetic ultra-fine particles, and the granular magnetic film has a high resistance. When a magnetic field is applied to the granular magnetic film to align the spins of the magnetic ultra-fine particles in the direction of the magnetic field, the resistance of the granular magnetic film decreases. As a result, the granular magnetic film exhibits a magnetoresistance effect based on spin dependent scattering.

Such a granular magnetic film obtained by dispersing magnetic ultra-fine particles in a non-magnetic metal matrix is manufactured easier than an artificial lattice film, and obtain a high magnetoresistance ratio of about 20% at room temperature. In addition, since each ultra-fine particle has a particle size of about several nm and a single magnetic domain, the hysteresis of a magnetoresistance curve is small, low noise is expected when the granular magnetic film is used as a magnetoresistance effect element.

In the conventional granular magnetic film described above, when the particle size of each magnetic ultra-fine particle is relatively large, irregular spin alignment cannot be easily obtained due to ferromagnetic coupling between the particles. This granular magnetic film has small magnetoresistance effect and is not preferably used as a magnetoresistance effect element. Therefore, the particle size of each magnetic ultra-fine particle is decreased to about several nm. However, since the ultra-fine particles are dispersed described above, a saturated magnetic field is large in its nature, and a large magnetic field of several teslas (T) or more must be essentially applied to the granular magnetic film to obtain a large magnetoresistance effect. This poses a problem in practice.

SUMMARY OF THE INVENTION

It is an object of the present invention to provide a magnetoresistance effect element having small hysteresis, a small saturated magnetic field, and a high magnetoresistance ratio.

According to an aspect of the present invention, there is provided a magnetoresistance effect element comprising a magnetic body in which magnetic metal particles containing at least one magnetic element selected from the group consisting of Fe, Co, and Ni are dispersed in a semiconductor matrix.

According to another aspect of the present invention, there is provided a magnetoresistance effect element comprising a multilayered film having at least one magnetic layer in which magnetic metal particles containing at least one magnetic element selected from the group consisting of Fe, Co, and Ni are dispersed in a semiconductor matrix, and at least one non-magnetic layer.

According to still another aspect of the present invention, there is provided a magnetoresistance effect element comprising a multilayered film having at least one first magnetic layer in which magnetic metal particles containing at least one magnetic element selected from the group consisting of Fe, Co, and Ni are dispersed in a semiconductor matrix, and at least one second magnetic layer containing at least one magnetic element selected from the group consisting of Fe, Co, and Ni.

According to still another aspect of the present invention, there is provided a magnetoresistance effect element comprising a multilayered film having a first magnetic layer in which magnetic metal particles containing at least one selected from the group consisting of Fe, Co, and Ni are dispersed in a semiconductor matrix, and a second magnetic layer having magnetism softer than that of the first magnetic layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 shows the energy levels of adjacent magnetic metal fine particles and a semiconductor matrix therebetween, and is a view for explaining the principle of the present invention;

FIGS. 2A and 2B are sectional views typically showing a magnetic material having a structure obtained by dispersing magnetic metal particles in a semiconductor matrix in a magnetoresistance effect element according to the present invention;

DETAILED DESCRIPTION OF THE PREFERRED EMBODIMENTS

Figure 3:
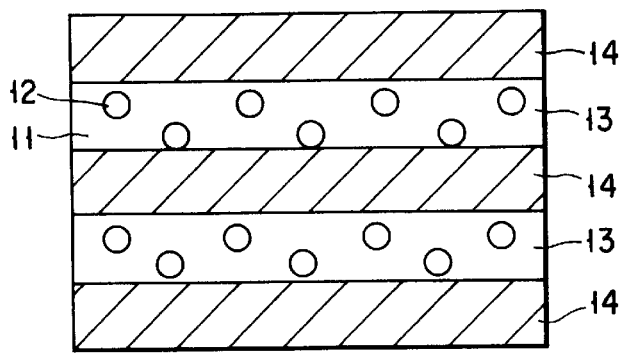
FIG. 3 is a sectional view showing a magnetoresistance effect element according to an embodiment of the present invention.

In a conventional granular magnetic film having a structure obtained by dispersing magnetic metal particles in a non-magnetic noble metal matrix, a saturated magnetic field is large mainly because the magnetic metal particles exhibit superparamagnetism due to the magnetic metal particles each having a small particle size of several nm. When the size of the magnetic metal particle is increased to a size which does not cause superparamagnetism, the saturated magnetic field becomes small. In this case, since the ferromagnetic coupling between the magnetic metal particles is enhanced, the spin directions of the magnetic metal particles are made uniform in a zero magnetic field. For this reason, even if a magnetic field is applied, the spin directions does not frequently change. As a result, a large magnetoresistance effect cannot be obtained.

The present inventors has found the following phenomenon. That is, when a semiconductor was used as a matrix, since an antiferromagnetic coupling effects always act between the magnetic metal particles, the spins of the magnetic metal particles are irregularly spun in a zero magnetic field, and the strength of the magnetic coupling is smaller than that of the magnetic coupling obtained by using a metal matrix.

When the magnetic metal particles are dispersed in the semiconductor matrix, conduction electrons from a metal flow in the semiconductor by the tunnel effect because a semiconductor generally has a potential higher than that of a metal. Energy levels obtained at this time are shown in FIG. 1. Referring to FIG. 1, the base energy of the conduction band of the metal is set to be 0, and the height of the potential of the semiconductor is represented by U. When a voltage V is applied to a sample, a potential difference of eV is generated between metal particles, and conduction electrons flow from one metal to the other metal through the semiconductor by the tunnel effect. The manner at this time is shown in FIG. 1 using a $\Psi_k$ (k: wave vector).

When the polarizability of the magnetic particle is represented by P; and the angle between the directions (arrow in FIG. 1) of magnetization of two magnetic particles, $\theta$, a conductance G is given by the following equation (J. C. Slonczewski, Phys. Rev. B39, 6995 (1989)).

$$G = G_0 (1 + P^2 \cos \theta)$$

According to this equation, the conductances G have a large difference when $\theta=0$ and $\theta=\pi$. More specifically, when the angle $\theta$ is changed by an external magnetic field, the conductance or resistance can be changed. This is the magnetoresistance effect of a system constituted by magnetic metal particles and a semiconductor matrix.

A tunnel current is generally small. For this reason, in a system obtained by dispersing magnetic metal particles in a semiconductor matrix, antiferromagnetic coupling having low coupling strength acts between the magnetic metal particles. Therefore, this system essentially has a saturated magnetic field smaller than that of a conventional granular system obtained by dispersing magnetic metal particles in a noble metal matrix. In addition, the size of the magnetic particle can be larger than that of a magnetic particle in a superparamagnetism area. For this reason, the saturated magnetic field decreases.

More specifically, since the semiconductor matrix is used, the following effects can be obtained.

(1) Even if the size of a magnetic metal particle is larger than that of a ultra-fine particle, irregular spin alignment can be realized in a zero magnetic field, and spin directions can be uniformed by applying a magnetic field. For this reason, an electric resistance can be decreased in the relatively large level by applying a magnetic field, and a relatively large magnetoresistance effect can be obtained.

(2) In this case, since the magnetic coupling between the magnetic metal particles has a low coupling strength as described above, a saturated magnetic field can be decreased, and a magnetoresistance effect can be generated by a small magnetic field. As a result, a magnetoresistance effect element having a high sensitivity can be realized.

Since the magnetoresistance effect element obtained by using the semiconductor as a matrix and dispersing the magnetic metal particles in the semiconductor matrix has a high resistivity, a large output voltage can be advantageously obtained. Therefore, the magnetoresistance effect can be detected by a small current, and the magnetoresistance effect element can be advantageously applied to a magnetoresistance effect type magnetic head or a magnetic field sensor.

The present invention will be described below with reference to embodiments.

FIGS. 2A and 2B are views typically showing a magnetic body in a magnetoresistance effect element according to the present invention having a basic structure obtained by dispersing magnetic metal particles in a semiconductor matrix. As shown in FIGS. 2A and 2B, the magnetoresistance effect element of the present invention has a magnetic body 3 obtained by dispersing magnetic metal particles 2 containing at least one magnetic element selected from the group consisting of Fe, Co, and Ni in a semiconductor matrix 1. Referring to FIG. 2A, a magnetic field H is at zero level, and spin directions 4 of the magnetic metal particles 2 are at random. Referring to FIG. 2B, the magnetic field H is larger than a saturated magnetic field $H_S$, and the spin direction 4 of the magnetic metal particles 2 are uniform.

As a semiconductor constituting the semiconductor matrix, a material having a small energy gap or a material having a large number of impurity levels are preferably used, more specifically, a material having an effective energy gap of 1 eV or less is preferably used. That is, when the effective energy gap of the semiconductor exceeds 1 eV, the semiconductor tends to have insulating characteristics. However, when the value is 1 eV or less, a tunnel current flows from the magnetic particle to the semiconductor matrix is larger, and carriers can be thermally excited to a conduction band of the semiconductor at room temperature. For this reason, the conductance is larger and the magnetic coupling between the magnetic metal particles can be made more antiferromagnetic, and a high magnetoresistive change rate can be obtained at room temperature. The further preferable range of the effective energy gap of the semiconductor is 0.1 eV or less.

The above-mentioned effective energy gap means an energy gap $E_g$ of an intrinsic semiconductor, and also means a difference $\Delta E_d$ between an impurity level and the base of a conduction band in an impurity semiconductor.

In any case, as a semiconductor constituting the matrix, a semiconductor in which the large tunnel current flows and/or which can be thermally excited at room temperature and has a sufficiently high carrier density in a conduction band is preferably used.

As such a semiconductor, an alloy or compound (crystal or amorphous) between a transition metal and Si or Ge, amorphous Si, amorphous Ge, an impurity semiconductor or the like can be used. The number of types of semiconductors constituting the matrix is not limited to one, the matrix may have a composite phase of two or more types of semiconductors. The impurity semiconductor may be of n-type or p-type, and its impurity concentration is preferably high in a certain degree and preferably falls within the range of about $10^{20}$–$10^{21}$ cm$^{-3}$. In addition, as the semiconductor constituting the semiconductor matrix, not only a normal semiconductor but also a defective oxide or the like exhibiting a semiconductor behavior, e.g., $Al_2O_3$ or $MgO_X$ may be used.

The magnetic metal particles contain at least one magnetic element selected from the group consisting of Fe, Co, and Ni. The magnetic metal particles may contain, in addition of the above single element, a Co-base alloy represented by CoFe, an Fe-base alloy represented by $Fe_8N$, and an Ni-base alloy represented by NiFe. In particular, as the magnetic metal particles, particles containing at least two magnetic elements selected from the group consisting of Fe, Co, and Ni are preferably used. In this manner, when the magnetic metal particles containing at least two selected from Fe, Co, and Ni are used, a magnetoresistance effect at a small magnetic field is considerably larger than that of the magnetic metal particles containing one selected from Fe, Co, and Ni.

The particle diameter of each magnetic metal particle preferably falls within the range of 5 to 100 nm. When the particle diameter falls within this range, the hysteresis of a magnetoresistance curve can be decreased because the magnetic metal particles have a single magnetic domain. However, when the particle diameter is smaller than 5 nm, the saturated magnetic field increases because the magnetic metal particles are in a range of ultra-fine particles. When the particle diameter exceeds 100 nm, the magnetoresistance effect considerably decreases.

In order to further decrease the saturated magnetic field, the magnetic anisotropy in the magnetic metal particles is preferably small. For this reason, magnetic metal particles are preferably formed of amorphous alloy. This is because the crystal magnetic anisotropy of an amorphous alloy is essentially zero. In addition, an amorphous alloy substantially having a magnetostriction of zero is preferably used because a magnetic anisotropy based on magnetoelasticity decreases. As the amorphous alloy substantially having a magnetostriction of zero, a material having a composition represented by $(Ni_xFe_yCo_z)_aX_{100-a}$ (where x=0 to 0.10, y=0.40 to 0.10, z=0.90 to 0.94, x+y+z=1, a=65 to 90, and X is at least one selected from the group consisting of Nb, Zr, Hf, Si, B, C, and P) is known.

Even if the magnetic metal particles are crystalline, when the magnetic metal particles have a magnetostrictive constant γ of $10^{-5}$ or less which is close to zero, the saturated magnetic field can be decreased. As the material having a magnetostrictive constant λ which close to zero, $Co_{90}Fe_{10}$, $Ni_{81}Fe_{19}$, $Ni_{66}Fe_{16}Co_{18}$, and the like are known.

The magnetic body obtained by dispersing magnetic metal particles in such a semiconductor matrix typically has a thin-film shape, and can be manufactured by a normal thin film forming apparatus using a molecular beam epitaxy (MBE) method, various sputtering method, or a deposition method. The shape of the magnetic material is not limited to a thin-film shape. The magnetic body may be foil formed by super quenching or the like.

The magnetoresistance effect element of the present invention may comprise the above single-layer magnetic body obtained by dispersing magnetic metal particles in such a semiconductor matrix. However, the magnetoresistance effect element is not limited to this, and the magnetoresistance effect element may comprise a multilayered film constituted by at least one non-magnetic layer and at least one magnetic layer obtained by dispersing magnetic metal particles containing one magnetic material selected from the group consisting of Fe, Co, and Ni in a semiconductor matrix, or a multilayered film constituted by at least one first magnetic layer obtained by dispersing magnetic metal particles containing at least one magnetic element selected from the group consisting of Fe, Co, and Ni in a semiconductor matrix and at least one second magnetic layer containing one magnetic element selected from the group consisting of Fe, Co, and Ni. According to such a multilayered film, the shape of the magnetic metal particles dispersed in the semiconductor matrix can be controlled to make a magnetic anisotropy based on the shape anisotropy of the magnetic metal particles small. For this reason, the saturated magnetic field can be further decreased, and a larger magnetoresistance effect can be obtained.

Figure 4:
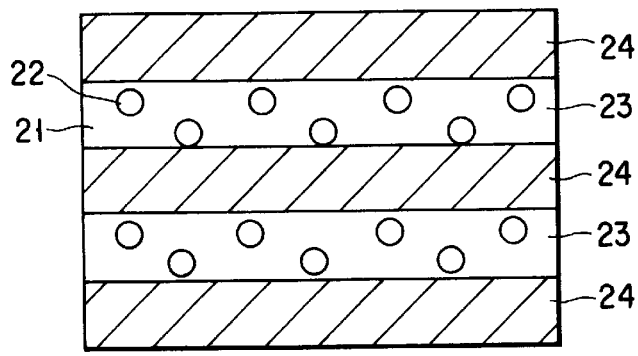
FIG. 4 is a sectional view showing a magnetoresistance effect element according to another embodiment of the present invention.

One of these multilayered films, for example, as shown in FIG. 3, has a structure in which a magnetic layer 13 obtained by dispersing magnetic metal particles 12 containing at least one magnetic element selected from the group consisting of Co, Fe, and Ni in a semiconductor matrix 11, and non-magnetic layer 14 are alternately stacked on each other. The other, as shown in FIG. 4, has a structure in which a first magnetic layer 23 obtained by dispersing magnetic metal particles 22 containing one magnetic element selected from the group consisting of Co, Fe, and Ni in a semiconductor matrix 21, and a second magnetic layer 24 formed of at least one element of Fe, Co, and Ni are alternately stacked on each other.

Such a multilayered film may have a structure in which a plurality of magnetic layers 13 and a plurality of non-magnetic layers 14 are alternately stacked on each other or a structure in which a plurality of first magnetic layers 23 and a plurality of second magnetic layers 24 are alternately stacked on each other. The multilayered film may have a structure in which the non-magnetic layer 14 is interposed between a pair of magnetic layers 13 or a structure in which the second magnetic layer 24 is interposed between a pair of first magnetic layers 23. In addition, when it is considered only that the shape of the magnetic metal particles dispersed in the semiconductor matrix is controlled to decrease a magnetic anisotropy based on the shape anisotropy of the magnetic metal particles, the multilayered film may have a structure in which the magnetic layer 13 is interposed between a pair of non-magnetic layers 14 or a structure in which the first magnetic layer 23 is interposed between a pair of second magnetic layers 24. When the structure in which these layers are alternately stacked on each other is used, the number of layers is not limited to a specific number. Furthermore, in any case, when the multilayered film constituted by a plurality of layers, these layers need not have the same composition and the equal thicknesses.

In the multilayered film shown in FIG. 3, the thickness of the magnetic layer is preferably set to be 0.5 to 20 nm, and the thickness of the non-magnetic layer is preferably set to be 1 to 10 nm. Although the material of the non-magnetic layer 14 interposed between the magnetic layers 13 is not limited to a specific material, the non-magnetic layer 14 is preferably formed of a semiconductor in consideration of the resistance of the non-magnetic layer. Such a semiconductor material is not limited to a specific semiconductor material.

In the multilayered film shown in FIG. 3, the thickness of the first magnetic film is preferably set to be 0.5 to 20 nm, and the thickness of the second magnetic layer is preferably used to be 2 to 30 nm.

These multilayered films typically have thin-film shapes, and can be formed by the above thin film forming technique. The multilayered films may be foil formed by super quenching or the like. In addition, although such a multilayered film may be formed by alternately forming a magnetic layer obtained by dispersing magnetic metal particles in a semiconductor matrix and a non-magnetic layer or a magnetic layer, the multilayered film can also be formed such that a magnetic layer consisting of at least one of Co, Fe, and Ni and a non-magnetic layer are alternately stacked on each other and then subjected to heat treatment to diffuse a semiconductor element in the magnetic layer.

The magnetoresistance effect element according to the present invention may comprise a multilayered film constituted by a first magnetic layer obtained by dispersing magnetic metal particles containing at least one of Fe, Co, and Ni in a semiconductor matrix and a second magnetic layer having magnetism softer than that of the first magnetic layer. In this manner, when the second magnetic layer having soft magnetism is used, a saturated magnetic field can be decreased while keeping a sufficiently high magnetoresistance ratio.

To have soft magnetism means to easily reverse the direction of a magnetic moment. For example, the magnetism is represented by the magnitude of a coercive force (Hc) in a ferromagnetic material. More specifically, as Hc is small, the magnetic layer can have soft magnetism. In this case, to have magnetism softer than that of the first magnetic layer is to have a saturated magnetic field (Hs) smaller than that of the first magnetic layer. In order to give such soft magnetism to the second magnetic layer, the second magnetic layer is preferably formed of a material having soft magnetism which is formed of a transition metal such as Fe, Co, or Ni or an alloy containing a transition metal, more specifically, a soft magnetic material such as a permalloy, a supermalloy, or a sendust which is conventionally used.

The thickness of the second magnetic layer having soft magnetism is preferably set to be about 0.5 to 100 nm, more preferably, 1 to 20 nm.

Figure 5:
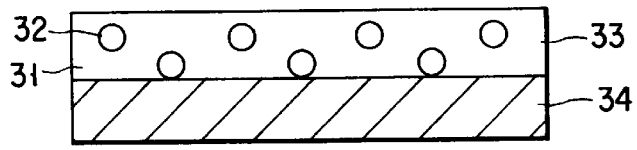
FIG. 5 is a sectional view showing a magnetoresistance effect element according to still another embodiment of the present invention.
Figure 6:
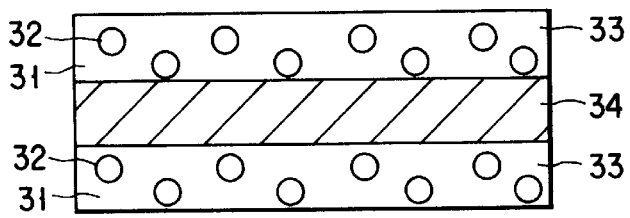
FIG. 6 is a sectional view showing another example of the magnetoresistance effect element of the embodiment shown in FIG. 5.
Figure 7:
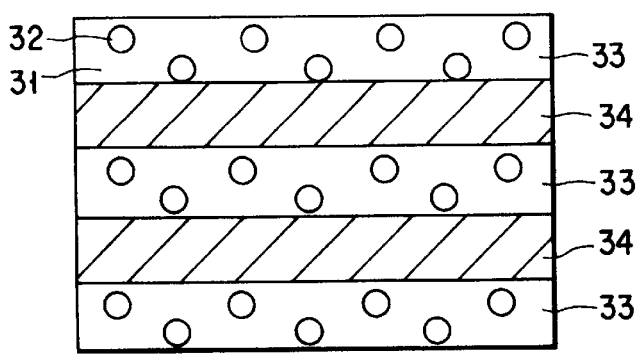
FIG. 7 is a sectional view showing still another example of the magnetoresistance effect element of the embodiment shown in FIG. 5.

A multilayered film, for example, as shown in FIG. 5, is constituted by a first magnetic layer 33 obtained by dispersing magnetic metal particles 32 in a semiconductor matrix 31, and a second magnetic layer 34 having soft magnetism. The second magnetic layer 34 may be formed after the first magnetic layer 33 is formed on a substrate; otherwise, the first magnetic layer 33 may be formed after the second magnetic layer 34 is formed on a substrate. One first magnetic layer 33 or a plurality of first magnetic layers 33 may be used. For example, as shown in FIG. 6, the second magnetic layer 34 may be interposed between the two first magnetic layers 33. One second magnetic layer 34 or a plurality of second magnetic layers 34 may be used. For example, as shown in FIG. 7, the first magnetic layers 33 and the second magnetic layers 34 may be alternately stacked on each other.

In such a magnetoresistance effect element, it is considered that a magnetic moment in the first magnetic layer 33 obtained by dispersing the magnetic metal particles 32 is easily reversed by the interaction of the second magnetic layer 34 having soft magnetism and a magnetic moment which can be easily reversed. More specifically, it is considered that, since the magnetic moment can be inverted by a small magnetic field while keeping a high magnetoresistance ratio obtained by the first magnetic layer 33 itself, high sensitivity can be obtained.

Note that such a multilayered film can be formed by using the thin film forming technique described above.

Figure 10:
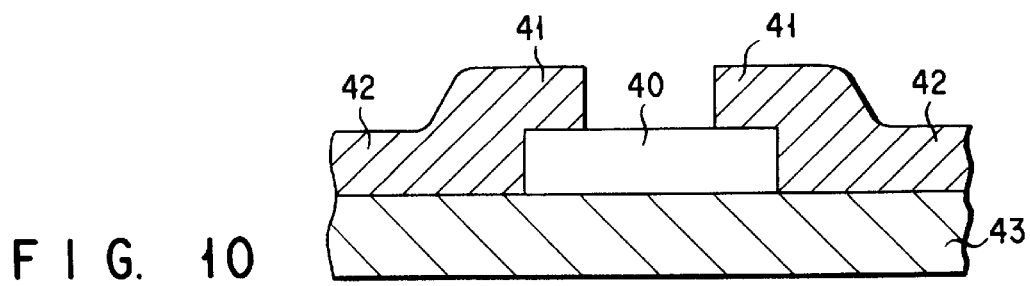
FIG. 10 is a sectional view showing a magnetoresistance effect element according to the present invention in the state of practical use.

In practical use of the magnetoresistance effect element according to the present invention, it is necessary to provide electrodes, as shown in FIG. 10. In FIG. 10, a magnetoresistance effect element 40 according to the present invention is formed on a substrate 43. The element 40 is provided with a pair of electrode portions 41. A pair of leads 42 are connected to the electrodes portions. It should be noted that the magnetoresistance element may be provided with an underlying layer or an overcoating layer which is formed of magnetic or nonmagnetic material.

(EXAMPLES)

Examples of a magnetic body in a magnetoresistance effect element according to the present invention having a basic structure obtained by dispersing magnetic metal particles in a semiconductor matrix.

Example 1

By using Fe and Si as vapor sources, and by using a molecular beam epitaxy (MBE) method, Fe, Si, and Fe films were sequentially formed on a thermally oxidized Si substrate. At this time, the substrate temperature was set to be 100° C. In this case, a plurality of films in which the thickness of each Fe film was fixed to 4 nm and the thickness of the Si film was changed were formed.

The structures of the resultant films were observed by using a transmission electron microscope. As a result, any film clearly exhibited no clear multilayered structure, and each film had a so-called granular structure in which Fe fine particles or ferromagnetic Fe-Si alloy fine particles each having a particle size of about 10 to 20 nm were dispersed in an Si-rich matrix.

Figure 8:
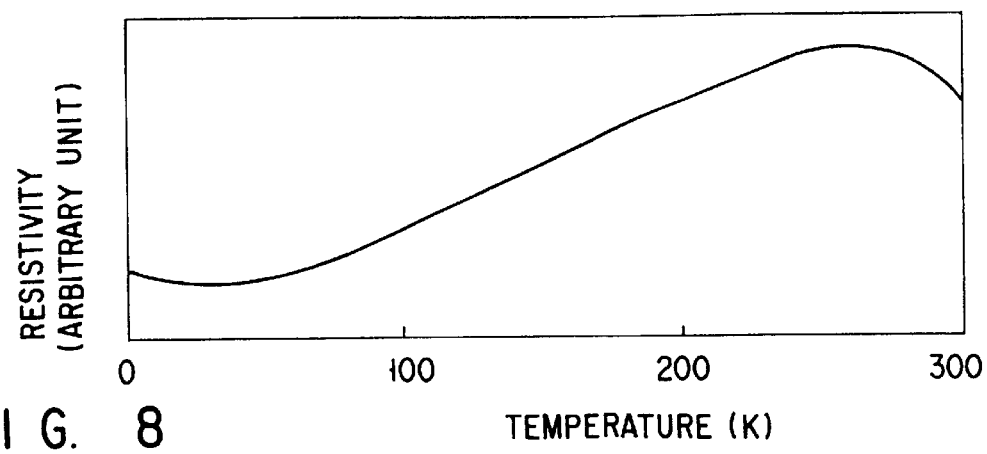
FIG. 8 is a graph showing a change in electric resistance of the magnetic material according to Example 1 of the present invention as a function of temperature.

When changes in electric resistance of these films as a function of temperature were measured, the resistivity at room temperature fell within the range of 180 Ω.cm to 280 Ω.cm depending on the thickness of the Si film, and the resistivity hear room temperature decreases with increasing temperature. For this reason, is was confirmed that each film had an electric resistance higher than that of a conventional granular film using a metal matrix by one or more order and that the matrix was a semiconductor. As an example, FIG. 8 shows a change in resistivity as a function of temperature when the Si layer has a thickness of 2 nm.

The matrix phase of the film having a 2 nm Si layer was identified by using an electron diffraction. As a result, it was confirmed that a non-magnetic semiconductor FeSi alloy was a main phase and that the film contained a small amount of amorphous Si.

Figure 9:
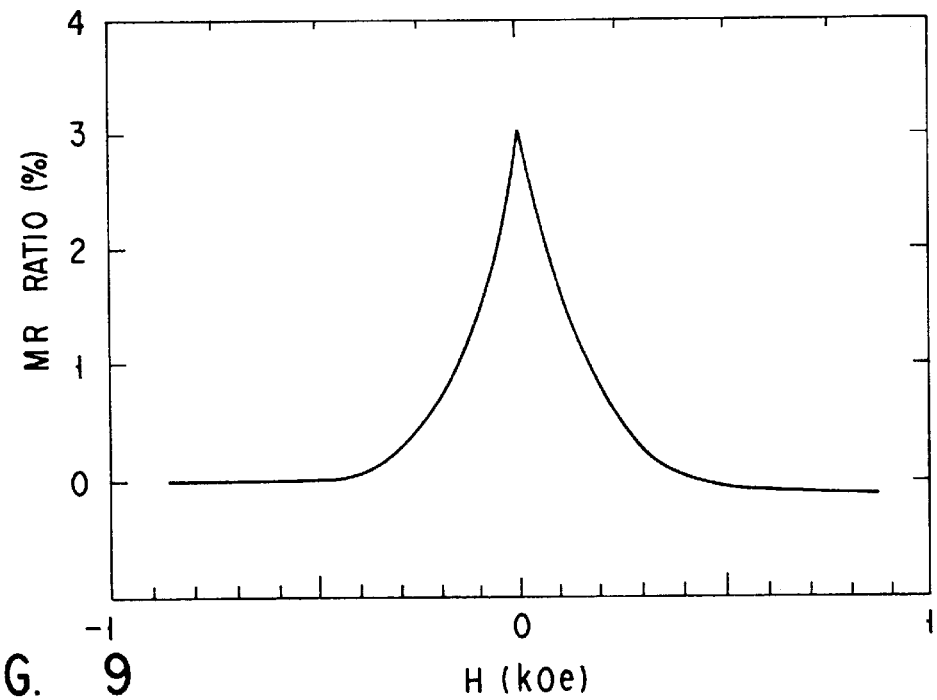
FIG. 9 is a graph showing a magnetoresistance effect curve of the magnetic material according to Example 1 of the present invention.

Subsequently, the magnetoresistance effect of this film was measured by using a DC four-point method. The obtained magnetoresistance effect curve is shown in FIG. 9. As is apparent from FIG. 9, a magnetoresistance ratio was 3%, and a saturated magnetic field was 0.03 T (=0.3 kOe). The value of the saturated magnetic field is smaller than that of a conventional granular magnetic film using a non-magnetic metal matrix by two or more orders.

Example 2

By using Co and Si as vapor sources, and by using an MBE method, Co, Si, and Co films were sequentially formed on a thermally oxidized Si substrate. At this time, the substrate temperature was set to be 100° C. In this case, a plurality of films in which the thickness of each Co film was fixed to 4 nm and the thickness of the Si film was changed were formed.

The structures of the resultant films were observed by using a transmission electron microscope. As a result, any film clearly exhibited no clear multilayered structure, and each film had a so-called granular structure in which Co fine particles or ferromagnetic Co-Si alloy fine particles each having a particle size of about 10 to 20 nm were dispersed in an Si-rich matrix.

The matrix phases of these films were identified by using an electron diffraction. As a result, it was confirmed that each matrix phase was constituted by a non-magnetic CoSi alloy phase and an amorphous Si phase.

Subsequently, the magnetoresistance effects of the films were measured by using a DC four-point method. When the thickness of the Si layer was 2 nm, a magnetoresistance ratio was 8%, and a saturated magnetic field was 0.01 T. The value of the saturated magnetic field is smaller than that of a conventional granular magnetic film using a non-magnetic metal matrix by two or more digits.

Example 3

By using an $Ni_{80}Fe_{20}$ alloy and Si as vapor sources, and by using an MBE method, $Ni_{80}Fe_{20}$ alloy, Si, and $Ni_{80}Fe_{20}$ alloy films were sequentially formed on a thermally oxidized Si substrate. At this time, the substrate temperature was set to be 100° C. In this case, a plurality of films in which the thickness of each $Ni_{80}Fe_{20}$ alloy film was fixed to 5 nm and the thickness of the Si film was changed were formed.

The structures of the resultant films were observed by using a transmission electron microscope. As a result, any film clearly exhibited no clear multilayered structure, and each film had a so-called granular structure in which $Ni_{80}Fe_{20}$ alloy fine particles or $Ni_{80}Fe_{20}$—Si alloy ferromagnetic fine particles each having a particle size of about 10 to 20 nm were dispersed in an Si-rich matrix.

The matrix phases of these films were identified by using an electron diffraction. As a result, it was confirmed that each matrix phase was constituted by a non-magnetic NiFeSi alloy phase and an amorphous Si phase.

Subsequently, the magnetoresistance effects of the films were measured by using a DC four-point method. When the thickness of the Si layer was 2 nm, a magnetoresistance ratio was 4%, and a magnetostrictive constant $\lambda$ of the ferromagnetic fine particles was a $10^{-6}$ order, i.e., almost zero. For this reason, a saturated magnetic field was especially small, i.e., 0.01 T. The value of the saturated magnetic field is smaller than that of a conventional granular magnetic film using a non-magnetic metal matrix by two or more orders.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetoresistance effect element comprising a magnetic body in which magnetic metal particles containing at least one magnetic element selected from the group consisting of Fe, Co, and Ni are dispersed in a semiconductor matrix containing a transition metal and having an effective energy gap of not more than about 1 eV.

2. The magnetoresistance effect element according to claim 1, wherein the magnetic metal particles contain at least two magnetic elements selected from the group consisting of Fe, Co, and Ni.

3. The magnetoresistance effect element according to claim 1, wherein substantially all of the magnetic metal particles has a particle diameter falling within the range of about 5 to about 100 nm.

4. The magnetoresistance effect element according to claim 1, wherein the magnetic metal particles substantially have a magnetostriction of zero.

5. The magnetoresistance effect element according to claim 1, wherein the semiconductor matrix has an effective energy gap of not more than about 0.1 eV.

6. The magnetoresistance effect element of claim 1, wherein said semiconductor matrix is an alloy or compound containing said transition metal, and Si or Ge.

7. A magnetoresistance effect element comprising a multilayered film having at least one magnetic layer in which magnetic metal particles containing at least one magnetic element selected from the group consisting of Fe, Co, and Ni are dispersed in a semiconductor matrix containing a transition metal and having an effective energy, gap of not more than about 1 eV, and at least one non-magnetic layer.

8. The magnetoresistance effect element according to claim 7, wherein the magnetic metal particles contain at least two magnetic elements selected from the group consisting of Fe, Co, and Ni.

9. The magnetoresistance effect element according to claim 7, wherein substantially all of the magnetic metal particles has a particle diameter falling within the range of about 5 to about 100 nm.

10. The magnetoresistance effect element according to claim 7, wherein the magnetic metal particles substantially have a magnetostriction of zero.

11. The magnetoresistance effect element according to claim 7, wherein the semiconductor matrix has an effective energy gap of not more than about 0.1 eV.

12. The magnetoresistance effect element according to claim 7, wherein said non-magnetic layer contains a semiconductor.

13. The magnetoresistance effect element of claim 7, wherein said semiconductor matrix is an alloy or compound containing said transition metal, and Si or Ge.

14. A magnetoresistance effect element comprising a multilayered film having at least one first magnetic layer in which magnetic metal particles containing at least one magnetic element selected from the group consisting of Fe, Co, and Ni are dispersed in a semiconductor matrix containing a transition metal and having an effective energy gap of not more than about 1 eV, and at least one second magnetic layer containing at least one magnetic element selected from the group consisting of Fe, Co, and Ni.

15. The magnetoresistance effect element according to claim 14, wherein the magnetic metal particles contain at least two magnetic elements selected from the group consisting of Fe, Co, and Ni.

16. The magnetoresistance effect element according to claim 14, wherein substantially all of the magnetic metal particles has a particle diameter falling within the range of about 5 to about 100 nm.

17. The magnetoresistance effect element according to claim 14, wherein the magnetic metal particles substantially have a magnetostriction of zero.

18. The magnetoresistance effect element according to claim 14, wherein the semiconductor matrix has an effective energy gap of not more than about 0.1 eV.

19. The magnetoresistance effect element of claim 14, wherein said semiconductor matrix is an alloy or compound containing said transition metal, and Si or Ge.

20. A magnetoresistance effect element comprising a multilayered film having a first magnetic layer in which magnetic metal particles containing at least one selected from the group consisting of Fe, Co, and Ni are dispersed in a semiconductor matrix containing a transition metal and having an effective energy gap of not more than about 1 eV, and a second magnetic layer having magnetism softer than that of said first magnetic layer.

* * * * *